United States Patent
Janik et al.

(10) Patent No.: US 11,938,512 B2
(45) Date of Patent: Mar. 26, 2024

(54) IN SITU POLYMERIZATION OF PARA-XYLENE FOR PRODUCTION OF PARYLENE F-LIKE COATING

(71) Applicant: HZO, Inc., Morrisville, NC (US)

(72) Inventors: John Janik, Raleigh, NC (US); Sean Clancy, Apex, NC (US); Benjamin Lawrence, Salt Lake City, UT (US)

( * ) Notice: Subject to any disclaimer, the term of this patent is extended or adjusted under 35 U.S.C. 154(b) by 0 days.

(21) Appl. No.: 16/673,810

(22) Filed: Nov. 4, 2019

(65) Prior Publication Data

US 2021/0129180 A1 May 6, 2021

(51) Int. Cl.
 *B05D 3/00* (2006.01)
 *B05D 1/00* (2006.01)
 *C09D 165/04* (2006.01)

(52) U.S. Cl.
 CPC ............. *B05D 1/62* (2013.01); *C09D 165/04* (2013.01)

(58) Field of Classification Search
 CPC ................................ B05D 1/60; B05D 7/5483
 See application file for complete search history.

(56) References Cited

U.S. PATENT DOCUMENTS

| | | | |
|---|---|---|---|
| 2006/0068519 A1* | 3/2006 | Dunbar | H10K 10/466 257/E21.259 |
| 2018/0258243 A1* | 9/2018 | Zheng | C09J 4/00 |
| 2019/0276933 A1* | 9/2019 | Zong | H01L 21/68792 |

OTHER PUBLICATIONS

Sigma Aldrich. 4'(Trifluoromethyl)acetophenon MSDS. (Year: 2019).*
PubChem. National Library of Medicine. 2023. https://pubchem.ncbi.nlm.nih.gov/compound/p-Xylene (Year: 2023).*

* cited by examiner

*Primary Examiner* — Dah-Wei D. Yuan
*Assistant Examiner* — Kristen A Dagenais
(74) *Attorney, Agent, or Firm* — Intellectual Strategies

(57) ABSTRACT

A method for depositing coating onto a substrate includes providing a monomer for creation of a protective coating on a substrate, energizing the monomer with a plasma generation system, and polymerizing the energized monomer onto the substrate in a plasma-enhanced chemical vapor deposition (PECVD) chamber.

7 Claims, 6 Drawing Sheets

IN SITU POLYMERIZATION OF PARA-XYLENE FOR PRODUCTION OF PARYLENE F-LIKE COATING

FIELD

This disclosure relates generally to deposition of protective coatings on substrates of electronic devices. More specifically, this disclosure relates to in situ polymerization of para-xylene for protective coating on substrates or electronic devices.

SUMMARY

The subject matter of the present application has been developed in response to the present state of the art, and in particular, in response to the problems and disadvantages associated with conventional parylene deposition that have not yet been fully solved by currently available techniques. Accordingly, the subject matter of the present application has been developed to provide embodiments of in situ polymerization of para-xylene for protective coating on substrates or electronic devices that overcome at least some of the shortcomings of prior art techniques.

Disclosed herein is a method for depositing a coating onto a substrate. The method includes providing a monomer for creation of a protective coating on a substrate, energizing the monomer with a plasma generation system, and polymerizing the energized monomer onto a substrate in a plasma-enhanced chemical vapor deposition (PECVD) chamber. The preceding subject matter of this paragraph characterizes example 1 of the present disclosure.

The monomer is energized before entering the PECVD chamber. The preceding subject matter of this paragraph characterizes example 2 of the present disclosure, wherein example 2 also includes the subject matter according to example 1, above.

The monomer is energized within the PECVD chamber. The preceding subject matter of this paragraph characterizes example 3 of the present disclosure, wherein example 3 also includes the subject matter according to any one of examples 1-2, above.

The method includes bubbling argon through a saturation bottle to move the monomer into the PECVD chamber. The preceding subject matter of this paragraph characterizes example 4 of the present disclosure, wherein example 4 also includes the subject matter according to any one of examples 1-3, above.

The monomer is a para-xylene monomer. The preceding subject matter of this paragraph characterizes example 5 of the present disclosure, wherein example 5 also includes the subject matter according to any one of examples 1-4, above.

The method includes bubbling argon through a saturation bottle for para-xylene monomer to move the para-xylene monomer into a PECVD chamber. The preceding subject matter of this paragraph characterizes example 6 of the present disclosure, wherein example 6 also includes the subject matter according to any one of examples 1-5, above.

The plasma generation system is a capacitively coupled radio frequency (RF) plasma generation system coupled to the PECVD chamber. The preceding subject matter of this paragraph characterizes example 7 of the present disclosure, wherein example 7 also includes the subject matter according to any one of examples 1-6, above.

The plasma generation system is a pulsed direct current (pulsed DC) plasma generation system coupled to the PECVD chamber. The preceding subject matter of this paragraph characterizes example 8 of the present disclosure, wherein example 8 also includes the subject matter according to any one of examples 1-7, above.

The plasma generation system is remote from the PECVD chamber. The preceding subject matter of this paragraph characterizes example 9 of the present disclosure, wherein example 9 also includes the subject matter according to any one of examples 1-8, above.

The monomer polymerizes by step-growth polymerization. The preceding subject matter of this paragraph characterizes example 10 of the present disclosure, wherein example 10 also includes the subject matter according to any one of examples 1-9, above.

Disclosed herein is a coating system. The system includes a plasma-enhanced chemical vapor deposition (PECVD) chamber. The system further includes a plasma generation system coupled with the PECVD chamber. The system further includes a precursor source, the precursor source comprising a monomer, the monomer configured to polymerize into a coating The preceding subject matter of this paragraph characterizes example 11 of the present disclosure.

The system includes a saturation bottle, wherein the saturation bottle is configured to bubble argon through the saturation bottle to move the monomer into a PECVD chamber. The preceding subject matter of this paragraph characterizes example 12 of the present disclosure, wherein example 12 also includes the subject matter according to example 11, above.

The plasma generation system is a capacitively coupled radio frequency (RF) plasma generation system coupled to the PECVD chamber. The preceding subject matter of this paragraph characterizes example 13 of the present disclosure, wherein example 13 also includes the subject matter according to any one of examples 11-12, above.

The plasma generation system is a pulsed direct current (pulsed DC) plasma generation system coupled to the PECVD chamber. The preceding subject matter of this paragraph characterizes example 14 of the present disclosure, wherein example 14 also includes the subject matter according to any one of examples 11-13, above.

The plasma generation system is remote from the PECVD chamber. The preceding subject matter of this paragraph characterizes example 15 of the present disclosure, wherein example 15 also includes the subject matter according to any one of examples 11-14, above.

The monomer is a para-xylene monomer. The preceding subject matter of this paragraph characterizes example 16 of the present disclosure, wherein example 16 also includes the subject matter according to any one of examples 11-15, above.

The plasma generation system is coupled directly to the PECVD chamber. The preceding subject matter of this paragraph characterizes example 17 of the present disclosure, wherein example 17 also includes the subject matter according to any one of examples 11-16, above.

The monomer polymerizes by step-growth polymerization. The preceding subject matter of this paragraph characterizes example 18 of the present disclosure, wherein example 18 also includes the subject matter according to any one of examples 11-17, above.

The precursor source intake into the PECVD chamber is on an opposite side of the PECVD chamber from the plasma generation system. The preceding subject matter of this paragraph characterizes example 19 of the present disclosure, wherein example 19 also includes the subject matter according to any one of examples 11-18, above.

The precursor source intake into the PECVD chamber is on a same side of the PECVD chamber as the plasma generation system. The preceding subject matter of this paragraph characterizes example 20 of the present disclosure, wherein example 20 also includes the subject matter according to any one of examples 11-18, above.

The described features, structures, advantages, and/or characteristics of the subject matter of the present disclosure may be combined in any suitable manner in one or more embodiments and/or implementations. In the following description, numerous specific details are provided to impart a thorough understanding of embodiments of the subject matter of the present disclosure. One skilled in the relevant art will recognize that the subject matter of the present disclosure may be practiced without one or more of the specific features, details, components, materials, and/or methods of a particular embodiment or implementation. In other instances, additional features and advantages may be recognized in certain embodiments and/or implementations that may not be present in all embodiments or implementations. Further, in some instances, well-known structures, materials, or operations are not shown or described in detail to avoid obscuring aspects of the subject matter of the present disclosure. The features and advantages of the subject matter of the present disclosure will become more fully apparent from the following description and appended claims, or may be learned by the practice of the subject matter as set forth hereinafter.

BRIEF DESCRIPTION OF THE DRAWINGS

In order that the advantages of the subject matter may be more readily understood, a more particular description of the subject matter briefly described above will be rendered by reference to specific embodiments that are illustrated in the appended drawings. Understanding that these drawings depict only typical embodiments of the subject matter and are not therefore to be considered to be limiting of its scope, the subject matter will be described and explained with additional specificity and detail through the use of the drawings, in which.

DETAILED DESCRIPTION

Figure 1:
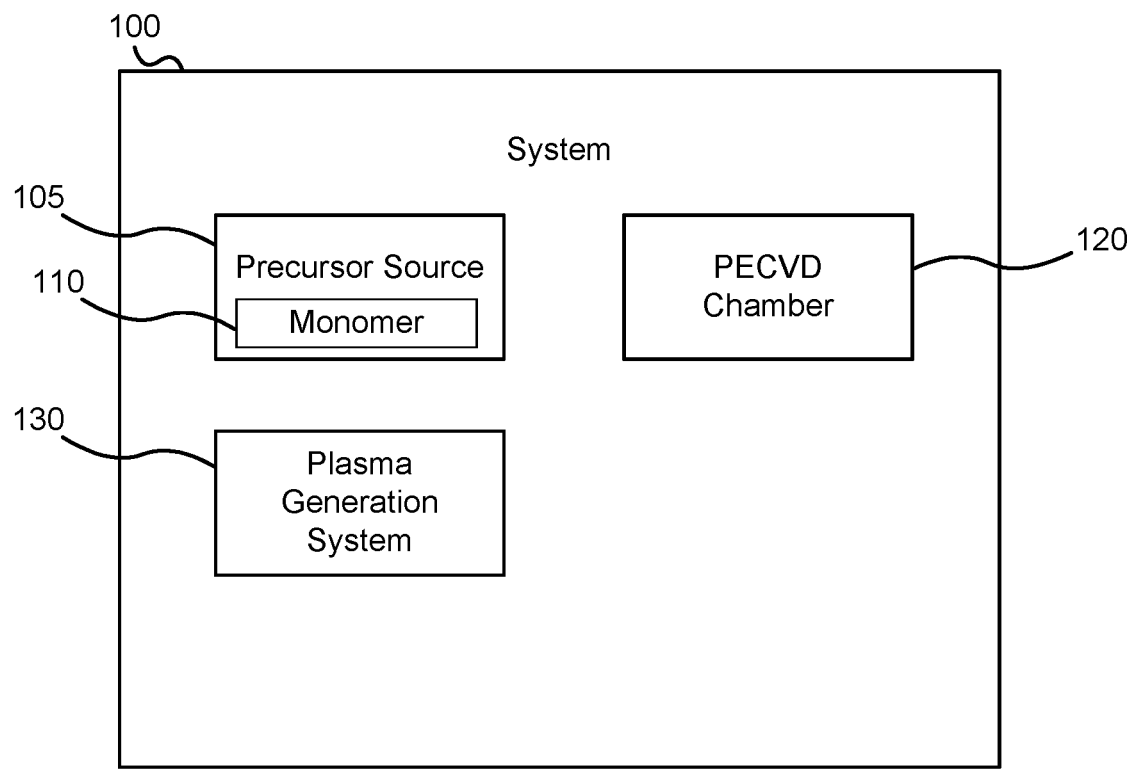
FIG. 1 is a system, according to one or more embodiments of the present disclosure.

Reference throughout this specification to "one embodiment," "an embodiment," or similar language means that a particular feature, structure, or characteristic described in connection with the embodiment is included in at least one embodiment of the present disclosure. Appearances of the phrases "in one embodiment," "in an embodiment," and similar language throughout this specification may, but do not necessarily, all refer to the same embodiment. Similarly, the use of the term "implementation" means an implementation having a particular feature, structure, or characteristic described in connection with one or more embodiments of the present disclosure, however, absent an express correlation to indicate otherwise, an implementation may be associated with one or more embodiments.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

Other aspects, as well as features and advantages of various aspects, of the disclosed subject matter will be apparent to those of ordinary skill in the art through consideration of this disclosure and the appended claims.

Moisture resistant coatings or films, as well as other coatings or films are used to protect various parts of electronic devices (or substrates) from external influences. Protective coatings, such as parylene, are deposited on parts of the electronic devices in deposition chambers. Parylene, and other protective coatings, are deposited on the parts of electronic devices in various methods and processes. Some of those processes, examples of which are described by U.S. Patent Application Publication Nos. 2009/0263581, 2009/0263641, 2009/0304549, 2010/0203347, 2010/0293812, and 2011/0262740, the entire disclosures of each of which are, by this reference, incorporated herein. The disclosures describe embodiments of equipment and/or processes that may be employed to apply a protective coating.

Various types of parylene exist including parylene C (poly(chloro-p-xylylene)), parylene F (which can specifically refer to parylene-VT4, parylene-AF4, or any other parylene with a fluorine atom or atoms in the molecular structure), parylene N (poly(p-xylylene)), parylene D (poly(dichloro-p-xylylene)), parylene A (amino-modified parylene), etc.

The various types of parylene have different features, benefits, and drawbacks when compared with each other. For example, the deposition time of parylene N is significantly longer than the deposition time for parylene C. The longer deposition time increases manufacturing time and costs. As another example, while parylene C provides quality water protection or water resistance, parylene C does not provide ultraviolet (UV) protection. While parylene F provides quality UV protection and high temperature protection, parylene F is more expensive than parylene N, as much as thirty five times more expensive.

The high quality properties of parylene F make it desirable for many applications but the high cost of traditional parylene F make it unsuitable in many situations for economic reasons. In many of the processes that are used to deposit Parylene F, a dimer is used as a precursor. To deposit the parylene F, the dimer must be cracked into monomers which are then transported to a deposition chamber in which the monomers are polymerized on a substrate through chain growth. The cost of the dimer can be prohibitively expensive.

Embodiments described herein utilize a para-xylene monomer (instead of a conventional dimer for traditional parylene production) to create a parylene F-like coating. Some embodiments eliminate the need of vaporization chambers which are configured to vaporize the dimer. Some embodiments eliminate the need of pyrolysis chambers which are configured to crack the dimer. Further hardware systems are not necessary to transport the product between the chambers.

Some embodiments result in step-growth polymerization as opposed to chain growth polymerization. Some embodiments utilize plasma polymerization to polymerize the para-xylene monomers. Some embodiments of the invention include utilization of para-xylene monomers.

Figure 2:
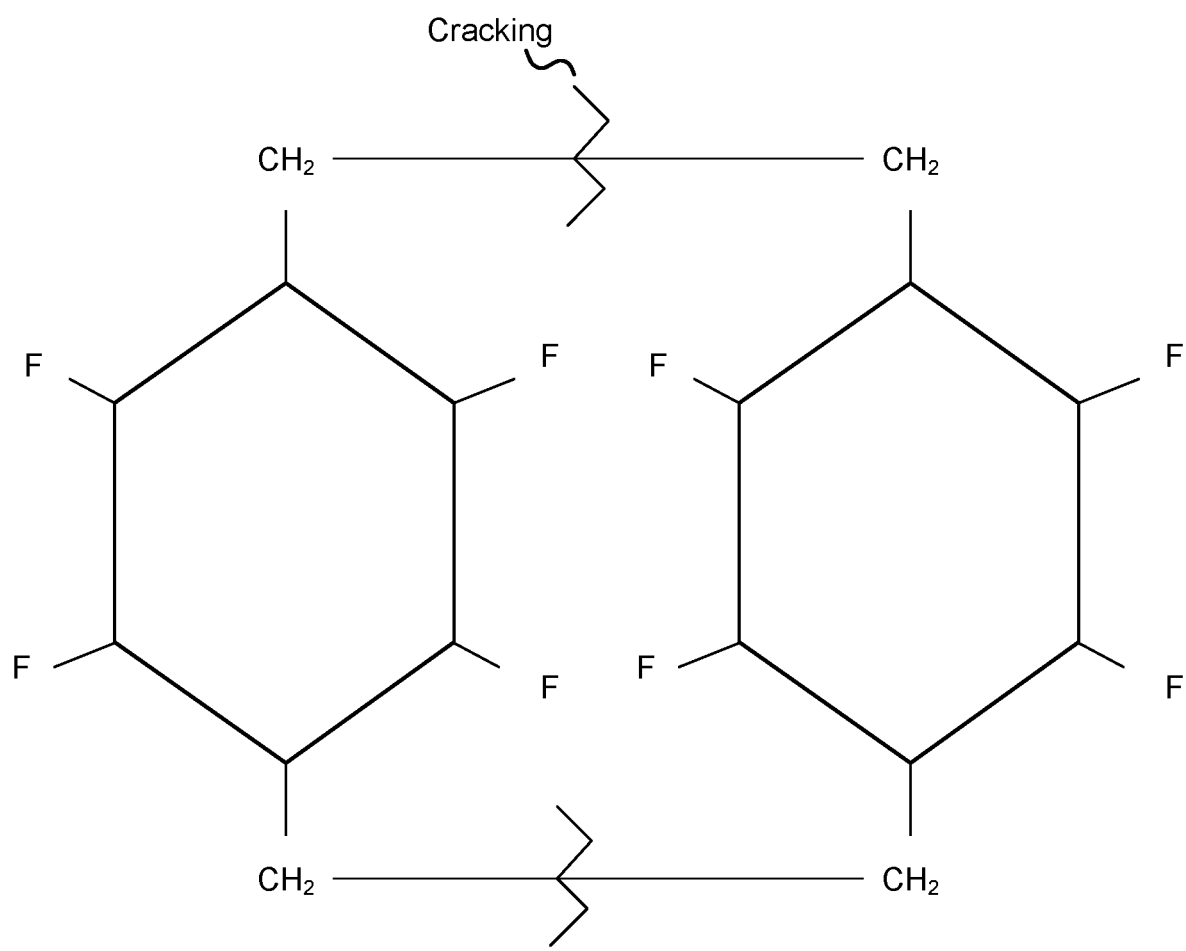
FIG. 2 is a schematic diagram of the structure of a dimer for parylene-VT4 is shown, according to one or more embodiments of the present disclosure.
Figure 3:
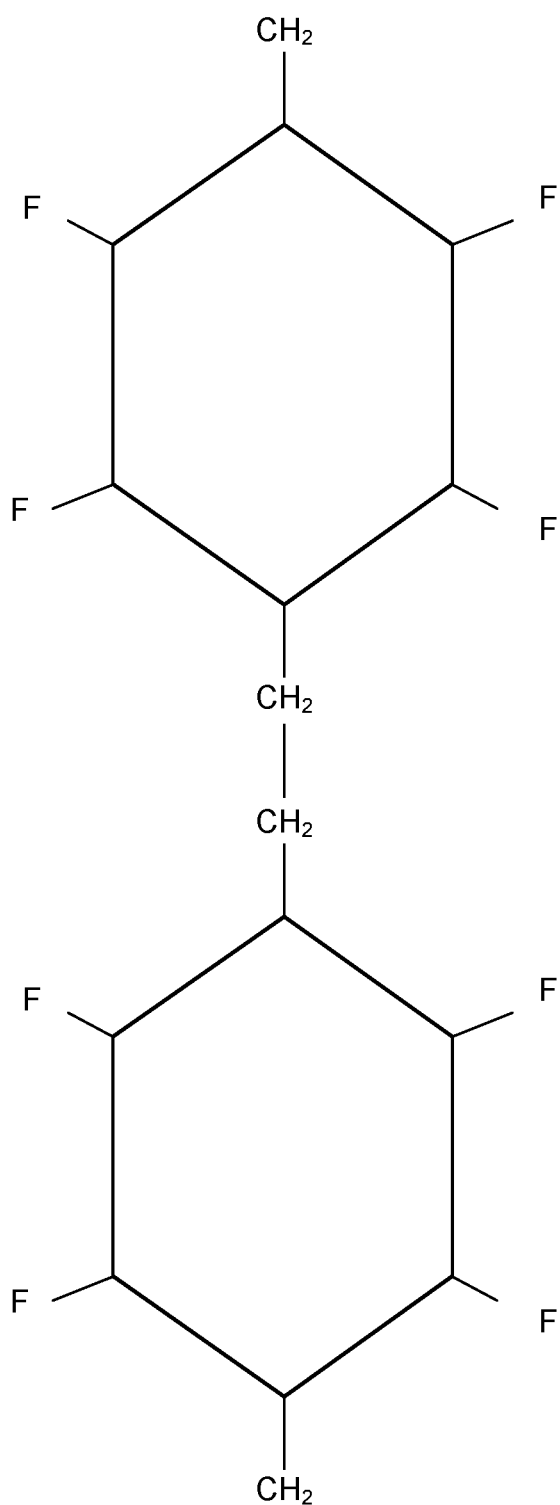
FIG. 3 is a schematic diagram of a polymer chain, according to one or more embodiments of the present disclosure.

Referring to FIG. 2, a dimer for parylene-VT4 is shown. The dimer shows bonds between the CH2 of one monomer to the CH2 of a second monomer and another bond with the other CH2 of the one monomer to the other CH2 of the second monomer. The weak link of the dimer is the bonds of the CH2 groups. After vaporization, the dimer is cracked in a pyrolysis chamber which results in the dimer separating into monomers. The pyrolized monomers are then fed into a deposition chamber where the monomers are polymerized. Referring to FIG. 3, the monomers are polymerized into a polymer chain links a sequence of monomers, bonding the CH2 of one monomer to the CH2 of another monomer and producing a chain growth of the monomers.

Figure 4:
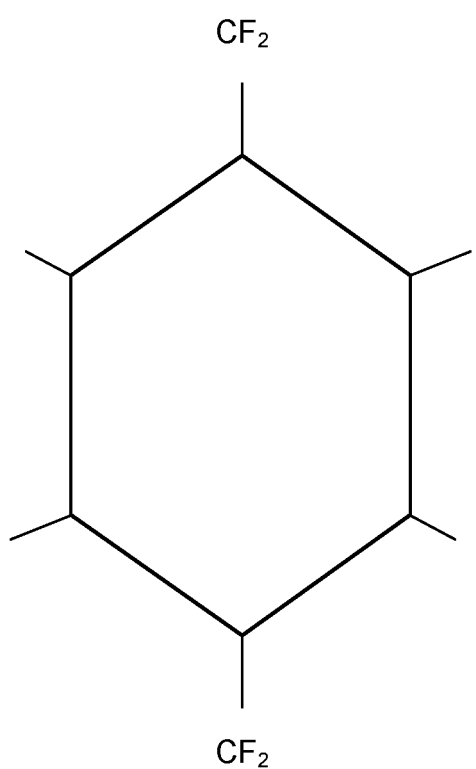
FIG. 4 is a monomer after cracking of parylene-AF4, according to one or more embodiments of the present disclosure.

Referring to FIG. 4, the monomer after cracking of parylene-AF4 is depicted. As depicted, the parylene-AF4 monomer has fluorine bonds which protect the compound. The weak link of the parylene-VT4 monomer is $CH_2$. Both the parylene-VT4 and the parylene-AF4 produce chain growth polymerization. That is, for the parylene-VT4 monomer, the $CH_2$ bonds to the $CH_2$ of another parylene-VT4 monomer. Additionally, for the parylene-AF4 monomer, the $CF_2$ of one parylene-AF4 monomer bonds to the $CF_2$ of another parylene-AF4 monomer.

Some embodiments of the invention utilize a monomer as a precursor to a protective coating. By utilizing a monomer instead of the dimer of parylene-AF4 or the dimer of parylene-VT4, the system does not need a vaporizer or a pyrolizer to crack a dimer. A monomer can be directly introduced into the deposition chamber.

Figure 5:
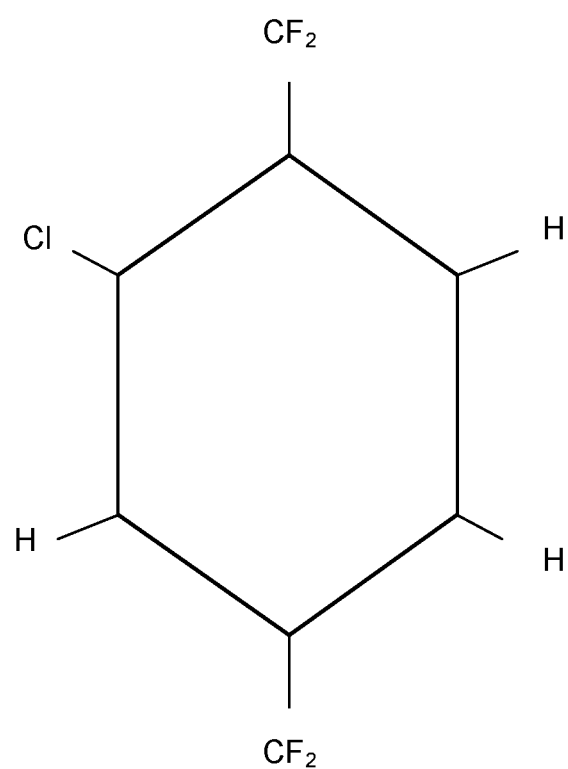
FIG. 5 is a schematic diagram of a monomer, according to one or more embodiments of the present disclosure.

Referring to FIG. 5, an embodiment of a monomer is shown. The monomer is a representative monomer used to apply a protective coating on a substrate or electronic device. The monomer is a benzene ring with fluorocarbons attached as substituents. In the depicted embodiment, chlorine is also a substituent. Other embodiments of monomers are contemplated.

In some embodiments, the monomer is a para-xylene. In some embodiments, the monomer is another type of aromatic hydrocarbon with two methyl groups occupying diametrically opposite substituent positions. Other atoms and molecules may occupy the diametrically opposite substituent positions. Other types of monomers may include, but is not limited to: 1,4-Bis(1-methoxyethyl)benzene; 1,4-bis(a-methoxyethyl)benzene; 2,5-dimethoxyethylbenzene; 1,4-Bis(1-methoxypropyl)benzene; 1,4-Bis(1-methoxy-2-methylpropyl)benzene; 1,4-Bis(1-methoxybutyl)benzene; 1-(1-methoxyethyl)-4-(1-methoxybutyl)benzene; 1-(1-methoxymethyl)-4-(1-methoxy-2-methylpropyl)benzene; 1-(1-methoxyethyl)-4-(1-methoxy-2-methylpropyl)benzene; 1-(1-methoxymethyl)-4-(1-methoxy-1-phenylmethyl)benzene; 1-(1-methoxyethyl)-4-(1-methoxy-1-phenylmethyl)benzene; 1-(1-methoxy-2-methylpropyl)-4-(1-methoxy-1-phenylmethyl)benzene; 1-(1-methoxymethyl)-4-(1-methoxy-1-tolylmethyl)benzene; 1,4-Bis(1-methoxy-1-phenylmethyl)benzene.

In some embodiments, the monomer is polymerized by a plasma. In some embodiments, the monomer is polymerized by a capacitively coupled RF plasma source. In some embodiments, the monomer is polymerized by a pulsed DC plasma source. Other forms of energy generation are contemplated herein.

The coatings applied to surfaces of the substrate may impart moisture resistance to the substrate. As used herein, the terms "moisture-resistant" and "moisture-resistance" refer to the ability of a coating to prevent exposure of a coated element or feature to moisture. As an example, a moisture-resistant coating may resist wetting or penetration by one or more types of moisture, or it may be impermeable to one or more types of moisture or substantially impermeable to one or more types of moisture. The term "substantially impermeable" indicates that over long durations of time, some moisture may migrate through the coating. Long durations of time may refer to periods of 5 years, 10 years, 15 years, or 20 years. When subjected to temperatures below 100° C., a long duration of time may refer to 20 years. "Moisture-resistant" may be defined, in some cases, as having a water vapor transmission less than 0.25 g-mil/100 $in^2$-day (at 38° C. and 90% relative humidity). Both moisture-impermeable and substantially moisture-impermeable barriers are, for the sake of simplicity, referred to herein as "moisture impermeable" barriers.

In some embodiments, a coating may be impermeable to, substantially impermeable to, and/or repel water, an aqueous solution (e.g., salt solutions, acidic solutions, basic solutions, drinks, etc.) or vapors of water or other aqueous materials (e.g., humidity, fogs, mists, wetness, etc.). The terms "moisture-resistant" and "moisture-resistance" may also refer to the ability of a coating to restrict permeation of or repel organic liquids or vapors (e.g., organic solvents, other organic materials in liquid or vapor form, etc.), as well as a variety of other substances, corrosive materials, or conditions that might damage a substrate (e.g., a moisture-sensitive substrate, etc.), such as an electronic device or its components.

Referring to FIG. 1, a system 100 is disclosed. The system 100 may be referred to a deposition system, an in situ polymerization system, or a plasma enhanced deposition system. Although the system 100 is shown and described with certain components and functionality, other embodiments of the system 100 may include fewer or more components to implement less or more functionality. The system 100 includes a precursor source 105, a plasma enhanced chemical vapor deposition (PECVD) chamber 120, and a plasma generation system 130.

The illustrated system 100 may also include processors, such as control processors, configured to control operations of the system 100, either alone or in conjunction with various processing sub-systems integrated into other systems or modules within the system 100. For example, the processor may communicate electronically with modules or other systems included in various embodiments described and contemplated herein.

The processor may include software capable of carrying out part or all of the functionality described in any methods, steps, processes, or other functional descriptions of the system 100 and its component sub-systems.

In some embodiments, the system 100 includes a precursor source 105. The precursor source 105 may be a repository or receptacle configured to hold a precursor. The precursor source 105 may include various valves and other components that allow the precursor source 105 to hold and distribute a precursor to the PECVD chamber or the plasma generation system 130.

The precursor may be a monomer 110. In some embodiments, the monomer 110 is a liquid monomer. Referring to FIG. 5, an embodiment of a monomer is shown. The monomer is a representative monomer used to apply a protective coating on a substrate or electronic device. The monomer is a benzene ring with fluorocarbons attached as substituents. In the depicted embodiment, chlorine is also a substituent. Other embodiments of monomers are contemplated.

In some embodiments, the monomer is a para-xylene. In some embodiments, the monomer is another type of aromatic hydrocarbon with two methyl groups occupying diametrically opposite substituent positions. Other atoms and molecules may occupy the diametrically opposite substituent positions. Other types of monomers may include, but is not limited to: 1,4-Bis(1-methoxyethyl)benzene; 1,4-bis(a-methoxyethyl)benzene; 2,5-dimethoxyethylbenzene; 1,4-Bis(1-methoxypropyl)benzene; 1,4-Bis(1-methoxy-2-methylpropyl)benzene; 1,4-Bis(1-methoxybutyl)benzene; 1-(1-methoxyethyl)-4-(1-methoxybutyl)benzene; 1-(1-methoxymethyl)-4-(1-methoxy-2-methylpropyl)benzene; 1-(1-methoxyethyl)-4-(1-methoxy-2-methylpropyl)benzene; 1-(1-methoxymethyl)-4-(1-methoxy-1-phenylmethyl)benzene; 1-(1-methoxyethyl)-4-(1-methoxy-1-phenylmethyl)benzene; 1-(1-methoxy-2-methylpropyl)-4-(1-methoxy-1-phenylmethyl)benzene; 1-(1-methoxymethyl)-4-(1-methoxy-1-tolylmethyl)benzene; 1,4-Bis(1-methoxy-1-phenylmethyl)benzene.

Referring again to FIG. 1, the system includes a plasma generation system 130. In some embodiments, the monomer 110 is energized by a plasma generation system 130. In some embodiments, the monomer 110 is polymerized by the plasma generation system 130. In some embodiments, the monomer is energized by a capacitively coupled RF plasma source. In some embodiments, the monomer 110 is polymerized by a pulsed DC plasma source. Other forms of energy generation are contemplated herein.

The plasma generation system 130 may be a pulsed direct current (pulsed DC) plasma generation system or a radio frequency (RF) plasma generation system, or another type of plasma generator.

In some embodiments, the plasma generation system 130 energizes the monomer 110 before the monomer 110 enters the PECVD chamber 120. In some embodiments, the plasma generation system 130 energizes the monomer 110 within the PECVD chamber 120. In some embodiments, the plasma generation system 130 energizes the monomer 110 in a conduit that conducts the monomer 110 from the precursor source 105 to the PECVD chamber 120. As such, the plasma generation system 130 may be coupled directly to the precursor source 105, the PECVD chamber 120, a conduit between the precursor source 105 and the PECVD chamber 120, or a separate chamber.

The plasma generation system 130 may be coupled directly to the PECVD chamber 120 in various locations to allow the monomer 110 to flow through or by the plasma generation system. This may occur in the PECVD chamber 120, in the conduit, or in the precursor source 105. In some embodiments, a precursor source intake is on a same side of the PECVD chamber 120 as the plasma generation system 130. In some embodiments, the precursor source intake is on an opposite side of the PECVD chamber 120 from the plasma generation system 130.

Figure 6:
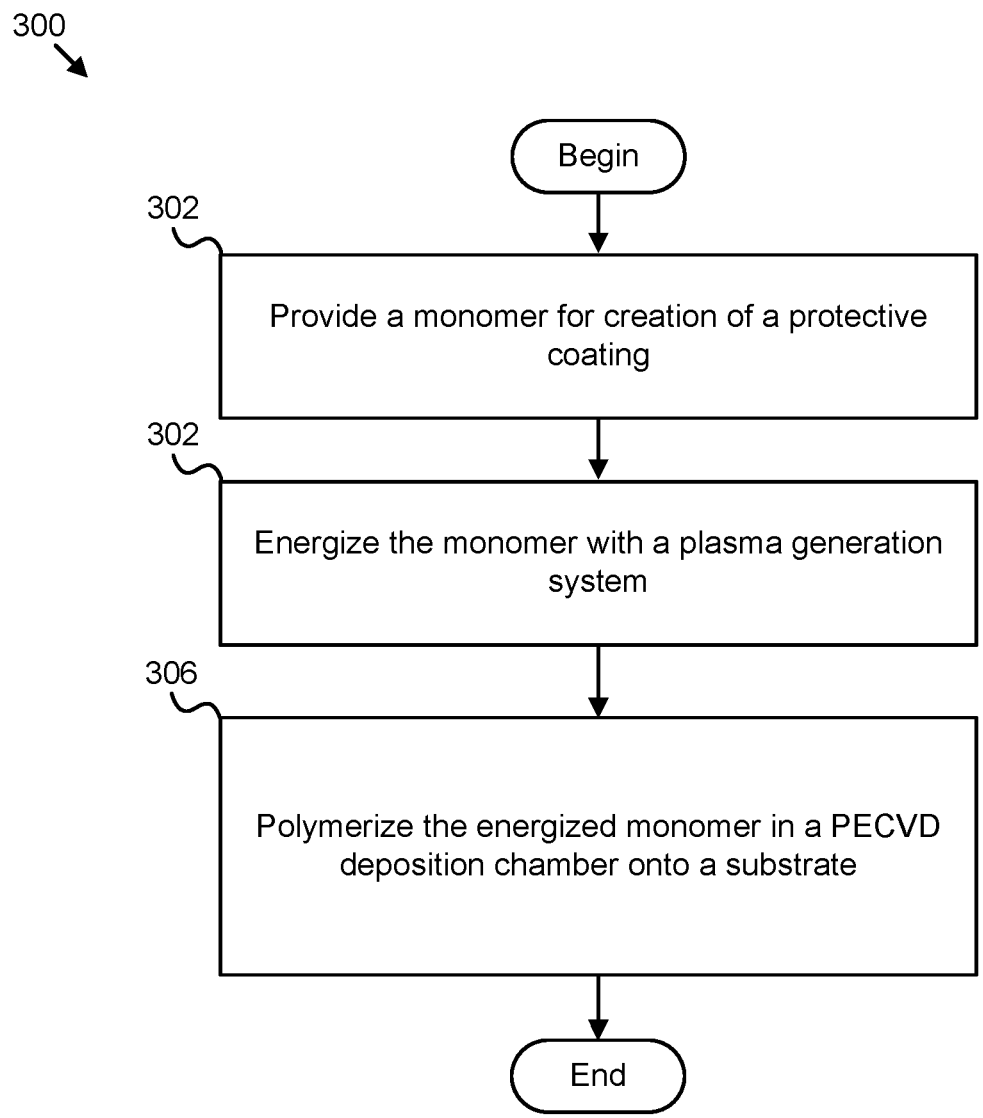
FIG. 6 is a schematic block diagram of a method, according to one or more embodiments of the present disclosure.

Referring to FIG. 6, a method 300 is disclosed. At block 302, the method 300 includes providing a monomer for creation of a protective coating on a substrate. At block 304, the method 300 includes energizing the monomer with a plasma generation system. At block 306, the method 300 includes polymerizing the energized monomer onto the substrate in a plasma-enhanced chemical vapor deposition (PECVD) chamber. The method 300 then ends.

In some embodiments, the monomer is energized before entering the PECVD chamber. This may occur in a separate chamber or in transit from the precursor source to the PECVD chamber. In some embodiments, the monomer is energized within the PECVD chamber. In some embodiments, the monomer is energized in a conduit that conducts the monomer from the precursor source to the PECVD chamber.

In some embodiments, the method further includes bubbling argon through a saturation bottle to move the monomer into the PECVD chamber. In some embodiments, the monomer is a para-xylene. Other methods of delivering the monomer to the PECVD chamber are also contemplated herein and are not discussed for the sake of brevity but may include pressure differential.

In some embodiments, the monomer is a para-xylene monomer. In some embodiments, the plasma generation system is a capacitively-coupled radio frequency (RF) plasma generation system. In some embodiments, the RF plasma generation system is coupled directly to the PECVD chamber to generate the plasma in the PECVD chamber. In some embodiments, the RF plasma generation system generates the plasma outside the PECVD chamber and is then transported into the PECVD chamber. In some embodiments, the RF plasma generation system generates the plasma in a separate chamber and energizes the monomer in the separate chamber. In some embodiments, the RF plasma generation system generates the plasma to energize the monomer in a conduit that conducts the monomer from the precursor source to the PECVD chamber. In some embodiments, the RF plasma generation system is remote from the PECVD chamber.

In some embodiments, the plasma generation system is a pulsed direct current (pulsed DC) plasma generation system. In some embodiments, the DC plasma generation system is coupled directly to the PECVD chamber to generate the plasma in the PECVD chamber. In some embodiments, the DC plasma generation system generates the plasma outside the PECVD chamber and is then transported into the PECVD chamber. In some embodiments, the DC plasma generation system generates the plasma in a separate chamber and energizes the monomer in the separate chamber. In some embodiments, the DC plasma generation system generates the plasma to energize the monomer in a conduit that conducts the monomer from the precursor source to the PECVD chamber. In some embodiments, the DC plasma generation system is remote from the PECVD chamber.

Although the foregoing disclosure provides many specifics, these should not be construed as limiting the scope of any of the ensuing claims. Other embodiments may be devised which do not depart from the scopes of the claims. Features from different embodiments may be employed in combination. The scope of each claim is, therefore, indicated and limited only by its plain language and the full scope of available legal equivalents to its elements.

The coatings applied to surfaces of the substrate may impart moisture resistance to the substrate. As used herein, the terms "moisture-resistant" and "moisture-resistance" refer to the ability of a coating to prevent exposure of a coated element or feature to moisture. As an example, a moisture-resistant coating may resist wetting or penetration by one or more types of moisture, or it may be impermeable to one or more types of moisture or substantially impermeable to one or more types of moisture. The term "substantially impermeable" indicates that over long durations of time, some moisture may migrate through the coating. Long durations of time may refer to periods of 5 years, 10 years, 15 years, or 20 years. When subjected to temperatures below 100° C., a long duration of time may refer to 20 years. "Moisture-resistant" may be defined, in some cases, as having a water vapor transmission less than 0.25 g-mil/100 in$^2$-day (at 38° C. and 90% relative humidity). Both moisture-impermeable and substantially moisture-impermeable barriers are, for the sake of simplicity, referred to herein as "moisture impermeable" barriers.

In some embodiments, a coating may be impermeable to, substantially impermeable to, and/or repel water, an aqueous solution (e.g., salt solutions, acidic solutions, basic solutions, drinks, etc.) or vapors of water or other aqueous materials (e.g., humidity, fogs, mists, wetness, etc.). The terms "moisture-resistant" and "moisture-resistance" may also refer to the ability of a coating to restrict permeation of or repel organic liquids or vapors (e.g., organic solvents, other organic materials in liquid or vapor form, etc.), as well as a variety of other substances, corrosive materials, or conditions that might damage a substrate (e.g., a moisture-sensitive substrate, etc.), such as an electronic device or its components.

Reference throughout this specification to features, advantages, or similar language does not imply that all of the features and advantages that may be realized with the subject matter of the present disclosure should be or are in any single embodiment. Rather, language referring to the features and advantages is understood to mean that a specific feature, advantage, or characteristic described in connection with an embodiment is included in at least one embodiment of the present disclosure. Thus, discussion of the features and advantages, and similar language, throughout this specification may, but do not necessarily, refer to the same embodiment.

In the above description, certain terms may be used such as "up," "down," "upper," "lower," "horizontal," "vertical," "left," "right," and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object. Further, the terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Additionally, instances in this specification where one element is "coupled" to another element can include direct and indirect coupling. Direct coupling can be defined as one element coupled to and in some contact with another element. Indirect coupling can be defined as coupling between two elements not in direct contact with each other, but having one or more additional elements between the coupled elements. Further, as used herein, securing one element to another element can include direct securing and indirect securing. Additionally, as used herein, "adjacent" does not necessarily denote contact. For example, one element can be adjacent another element without being in contact with that element.

As used herein, the phrase "at least one of", when used with a list of items, means different combinations of one or more of the listed items may be used and only one of the items in the list may be needed. The item may be a particular object, thing, or category. In other words, "at least one of" means any combination of items or number of items may be used from the list, but not all of the items in the list may be required. For example, "at least one of item A, item B, and item C" may mean item A; item A and item B; item B; item A, item B, and item C; or item B and item C. In some cases, "at least one of item A, item B, and item C" may mean, for example, without limitation, two of item A, one of item B, and ten of item C; four of item B and seven of item C; or some other suitable combination.

As used herein, a system, apparatus, structure, article, element, component, or hardware "configured to" perform a specified function is indeed capable of performing the specified function without any alteration, rather than merely having potential to perform the specified function after further modification. In other words, the system, apparatus, structure, article, element, component, or hardware "configured to" perform a specified function is specifically selected, created, implemented, utilized, programmed, and/or designed for the purpose of performing the specified function. As used herein, "configured to" denotes existing characteristics of a system, apparatus, structure, article, element, component, or hardware which enable the system, apparatus, structure, article, element, component, or hardware to perform the specified function without further modification. For purposes of this disclosure, a system, apparatus, structure, article, element, component, or hardware described as being "configured to" perform a particular function may additionally or alternatively be described as being "adapted to" and/or as being "operative to" perform that function.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

The present subject matter may be embodied in other specific forms without departing from its spirit or essential characteristics. The described embodiments are to be considered in all respects only as illustrative and not restrictive.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

What is claimed:

1. A method for depositing coating onto a substrate, comprising:
    providing a monomer for creation of a protective coating on a substrate, wherein the monomer comprises one of: 1,4-Bis(1-methoxyethyl)benzene; 1,4-bis(a-methoxyethyl) benzene; 2,5--dimethoxyethylbenzene; 1,4-Bis (1-mthoxypropyl)benzene; 1,4-Bis(1-methoxy--2—methylpropyl)benzene; 1,4-Bis(1-methoxybutyl) benzene; 1-(1-methoxyethyl)-4-(1-methoxybutyl) benzene; 1-(1-methoxymethyl); 4-(1-methoxy-2-methylpropyl)benzene; 1-(1-methoxyethyl)-4-(1-methoxy-2-methylpropyl)benzene; 1-(1-methoxymethyl)-4-(1-methoxy-1-phenylmethyl) benzene; 1-(1-methoxyethyl)-4-(1-methoxy-1-phenylmethyl)benzene; 1-(1-methoxy-2- methylpropyl)-4-(1-methoxy-1-phenylmethyl)
benzene; 1-(1-methoxymethyl)-4-(1-methoxy-1-tolylmethyl)benzene or 1,4-Bis(1-methoxy-1-phenylmethyl)benzene;

energizing the monomer with a plasma generation system; and polymerizing the energized monomer onto the substrate in a plasma-enhanced chemical vapor deposition (PECVD) chamber to form a coating, wherein the monomer is energized before entering the PECVD chamber, and wherein the monomer polymerizes by step-growth polymerization.

2. The method of claim 1, wherein the monomer is further energized within the PECVD chamber, and wherein the plasma generation system is coupled to the PECVD chamber with a precursor source of the monomer is positioned on a same side of the PECVD chamber as the plasma generation system such that the monomer flows by the plasma generation system.

3. The method of claim 1, wherein the monomer is energized in a conduit that conducts the monomer from a precursor source to the PECVD chamber.

4. The method of claim 1, further comprising bubbling argon through a saturation bottle to move the monomer into the PECVD chamber.

5. The method of claim 1, wherein the plasma generation system is a capacitively coupled radio frequency (RF) plasma generation system coupled to the PECVD chamber.

6. The method of claim 1, wherein the plasma generation system is a pulsed direct current (pulsed DC) plasma generation system coupled to the PECVD chamber.

7. The method of claim 1, wherein the plasma generation system is remote from the PECVD.

* * * * *